US009281160B2

(12) United States Patent
Sato (10) Patent No.: US 9,281,160 B2
(45) Date of Patent: Mar. 8, 2016

(54) INSULATION STRUCTURE AND INSULATION METHOD

(71) Applicant: SEN Corporation, Tokyo (JP)

(72) Inventor: Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/291,766

(22) Filed: May 30, 2014

(65) Prior Publication Data

US 2014/0353518 A1 Dec. 4, 2014

(30) Foreign Application Priority Data

May 31, 2013 (JP) .................................. 2013-115318

(51) Int. Cl.
*H01J 37/08* (2006.01)
*H01J 37/02* (2006.01)
(Continued)

(52) U.S. Cl.
CPC ............... *H01J 37/08* (2013.01); *H01J 27/024* (2013.01); *H01J 37/3171* (2013.01); *H01J 2237/022* (2013.01); *H01J 2237/026* (2013.01); *H01J 2237/0213* (2013.01); *H01J 2237/032* (2013.01); *H01J 2237/036* (2013.01); *H01J 2237/038* (2013.01); *H01J 2237/08* (2013.01); *H01J 2237/31701* (2013.01)

(58) Field of Classification Search
CPC ...................... H01J 2237/038; H01J 2237/036; H01J 37/08; H01J 37/3171; H01J 2237/31701; H01J 2237/08; H01J 27/022; H01J 27/08; H01J 37/15; H01J 37/32412; H01J 5/10
See application file for complete search history.

(56) References Cited

U.S. PATENT DOCUMENTS 4,963,735 A * 10/1990 Okamoto et al. ............. 250/288
5,607,541 A * 3/1997 Kubota et al. ................. 156/538
5,920,076 A * 7/1999 Burgin et al. ............ 250/492.21
(Continued)

FOREIGN PATENT DOCUMENTS

JP S63-502707 A 10/1988
JP H2-072544 A 3/1990
(Continued)

OTHER PUBLICATIONS

Kuniaki et al., "Quantitative measurement of surface roughness of graphite, silicon carbide and molybdenum irradiated with energetic deuterons" Journal of Nuclear Materials, vols. 76-77, Sep.-Oct. 1978.*

(Continued)

*Primary Examiner* — Michael Logie
(74) *Attorney, Agent, or Firm* — Michael Best & Friedrich LLP (57) ABSTRACT

An insulation structure provided among a plurality of electrodes for extraction of an ion beam from a plasma generating section is provided. The insulation structure includes an insulation member including a first part connected to a first electrode and a second part connected to a second electrode and configured to support the first electrode to the second electrode, a first cover surrounding at least a part of the first part to protect the first part from contamination particles, and a second cover surrounding at least a part of the second part to protect the second part from contamination particles. At least one of the first part and the second part is made of a machinable ceramic or a porous ceramic.

23 Claims, 6 Drawing Sheets

(51) Int. Cl.
*H01J 27/02* (2006.01)
*H01J 37/317* (2006.01)

(56) References Cited

U.S. PATENT DOCUMENTS

| | | | | |
|---|---|---|---|---|
| 6,034,330 | A * | 3/2000 | Pratt | 174/178 |
| 6,060,715 | A * | 5/2000 | England et al. | 250/492.21 |
| 6,559,454 | B1 * | 5/2003 | Murrell et al. | 250/423 R |
| 7,498,544 | B2 * | 3/2009 | Saijo et al. | 219/402 |
| 8,080,813 | B2 * | 12/2011 | Jang et al. | 250/492.21 |
| 8,217,347 | B2 * | 7/2012 | Banine et al. | 250/307 |
| 8,410,704 | B1 * | 4/2013 | Cooley et al. | 315/111.21 |
| 2005/0151089 | A1 * | 7/2005 | Bong et al. | 250/396 R |
| 2006/0165994 | A1 * | 7/2006 | Dalakos et al. | 428/408 |
| 2007/0144250 | A1 * | 6/2007 | Ramsesh | 73/204.22 |
| 2010/0072402 | A1 * | 3/2010 | Satoh et al. | 250/492.21 |
| 2010/0154835 | A1 * | 6/2010 | Dimeo et al. | 134/31 |
| 2010/0176313 | A1 * | 7/2010 | Melnychuk et al. | 250/504 R |
| 2010/0276127 | A1 * | 11/2010 | Barnes | 165/135 |
| 2011/0265821 | A1 * | 11/2011 | Tay et al. | 134/10 |
| 2012/0049738 | A1 * | 3/2012 | Fujita et al. | 315/111.81 |
| 2012/0241610 | A1 * | 9/2012 | Banine et al. | 250/311 |
| 2013/0001416 | A1 * | 1/2013 | Cooley et al. | 250/288 |
| 2014/0145581 | A1 * | 5/2014 | Jerez et al. | 313/36 |
| 2014/0284447 | A1 * | 9/2014 | Kuhn et al. | 248/676 |

FOREIGN PATENT DOCUMENTS

| | | | | |
|---|---|---|---|---|
| JP | H3-53402 Y2 | | 11/1991 | |
| JP | H7-99683 B2 | | 10/1995 | |
| JP | 09022675 A | * | 1/1997 | H01J 37/08 |
| JP | 11329269 A | * | 11/1999 | H01J 27/08 |
| JP | 3141331 B2 | | 3/2001 | |
| JP | 3516262 B2 | | 4/2004 | |
| KR | 20020047869 | * | 6/2002 | H01L 21/265 |
| WO | WO-87/05438 A1 | | 9/1987 | |

OTHER PUBLICATIONS

Machine translation of JP09022675A cited above in Foreign patent documents.*

* cited by examiner

INSULATION STRUCTURE AND INSULATION METHOD

BACKGROUND OF THE INVENTION

1. Field of the Invention

The present invention relates to an insulation structure and an insulation method appropriate to an ion implantation apparatus or an extraction electrode system in an ion source of the ion implantation apparatus.

2. Description of the Related Art

An ion source is provided with an extraction electrode system adapted to extract an ion beam. The extraction electrode system includes several electrodes, and one electrode is supported to the other electrode or a surrounding structure by an insulator.

Depending on a material for the ion beam and a configuration of the ion source, conductive contamination particles are extracted together with the ion beam. Deposition of the contamination particles can form a conductive path on a surface of the insulator. Sufficient insulation cannot be maintained, which may impair normal operations of an apparatus. In a case where a large amount of contamination particles are generated, frequent maintenance of the insulation part is required, and an operation ratio of the apparatus is lowered.

SUMMARY OF THE INVENTION

An illustrative object of an aspect of the present invention is to provide an insulation structure and an insulation method contributing to reduce maintenance frequency and improve an apparatus operation ratio.

According to an aspect of the present invention, there is provided an insulation structure provided among a plurality of electrodes for extraction of an ion beam from a plasma generating section. The plurality of electrodes includes a first electrode and a second electrode to which different potential from that of the first electrode is applied. The insulation structure includes: an insulation member including a first part connected to the first electrode and a second part connected to the second electrode and configured to support the first electrode to the second electrode; a first protection member surrounding at least a part of the first part to protect the first part from contamination particles; and a second protection member surrounding at least a part of the second part to protect the second part from contamination particles. At least one of the first part and the second part is made of a machinable ceramic or a porous ceramic.

According to an aspect of the present invention, there is provided an insulation method. The method includes: applying a potential difference between a first electrode and a second electrode supporting the first electrode by an insulation member; extracting an ion beam from a plasma generating section by using the first electrode and the second electrode; and protecting the insulation member from contamination particles by using a protection member. The insulation member includes a first part connected to the first electrode and a second part connected to the second electrode, and at least one of the first part and the second part is made of a machinable ceramic or a porous ceramic.

According to an aspect of the present invention, there is provided an insulation structure provided among a plurality of electrodes for extraction of an ion beam from a plasma generating section. The plurality of electrodes includes a first electrode and a second electrode to which different potential from that of the first electrode is applied. The insulation structure includes: an insulation member configured to support the first electrode to the second electrode; and a protection member configured to protect the insulation member from contamination particles. The protection member includes an adsorption surface adsorbing the contamination particles.

According to an aspect of the present invention, there is provided an insulation structure provided among a plurality of electrodes for extraction of an ion beam from a plasma generating section. The plurality of electrodes includes a first electrode and a second electrode to which different potential from that of the first electrode is applied. The insulation structure includes: an insulation member configured to support the first electrode to the second electrode. The insulation member includes a first part on aside of the first electrode and a second part on a side of the second electrode, and at least one of the first part and the second part is made of a machinable ceramic or a porous ceramic.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

Embodiments of the present invention will be described in details hereinbelow with reference to the drawings. It is to be noted that, in description with reference to the drawings, identical components may be shown with the same reference numerals, and description of the duplicate components may not be repeated. Also, configurations described below are illustrative only and do not limit the scope of the present invention.

Figure 1:
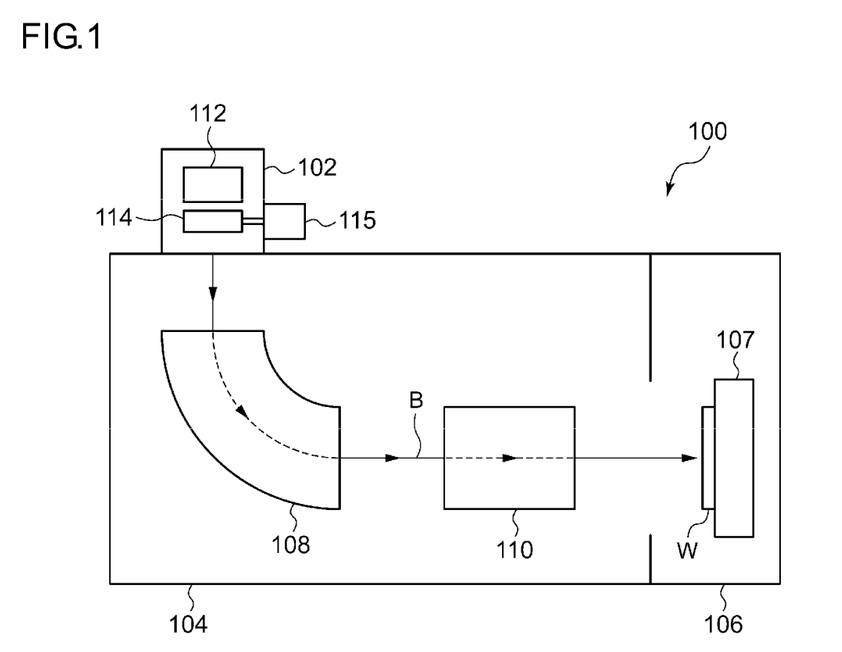
FIG. 1 schematically illustrates an ion implantation apparatus according to an embodiment of the present invention.

FIG. 1 schematically illustrates anion implantation apparatus 100 according to an embodiment of the present invention. The ion implantation apparatus 100 is configured to perform an ion implantation process to a surface of a workpiece W. The workpiece W is a substrate, for example, such as a wafer. Thus, hereinbelow, the workpiece W may be referred to as a substrate W for convenience of description, but it is not intended to limit an object under an implantation process to a specific object.

The ion implantation apparatus 100 includes an ion source unit 102, a beamline unit 104, and an implantation processing chamber 106. The ion implantation apparatus 100 is configured to irradiate the entire substrate W with an ion beam B by at least one of beam scan and mechanical scan.

The ion source unit 102 is configured to supply the beamline unit 104 with the ion beam B. Although details thereof will be described below with reference to FIG. 2, the ion source unit 102 includes an ion source 112 and an extraction electrode section 114 configured to extract the ion beam B from the ion source 112. The ion source unit 102 also includes an extraction electrode driving mechanism 115 configured to adjust a position and/or an orientation of the extraction electrode section 114 with respect to the ion source 112.

The beamline unit 104 is configured to transport ions from the ion source unit 102 to the implantation processing chamber 106. On a downstream of the ion source unit 102 is provided a mass analyzer 108, which is configured to sort required ions from the ion beam B.

The beamline unit 104 provides the ion beam B having passed through the mass analyzer 108 with operations such as deflection, acceleration, deceleration, shaping, and scan. For example, the beamline unit 104 may include a beam scan unit 110 applying an electric field or a magnetic field (or both) to the ion beam B to scan the ion beam B. In this manner, the beamline unit 104 supplies the ion beam B with which the substrate W is to be irradiated to the implantation processing chamber 106.

The implantation processing chamber 106 includes an object holder 107 holding one or a plurality of substrates W. The object holder 107 is configured to provide the substrate W with relative movement (so to speak, mechanical scan) to the ion beam B as needed.

Also, the ion implantation apparatus 100 includes a vacuum exhaust system (not illustrated) configured to provide a desired vacuum environment to the ion source unit 102, the beamline unit 104, and the implantation processing chamber 106.

Figure 2:
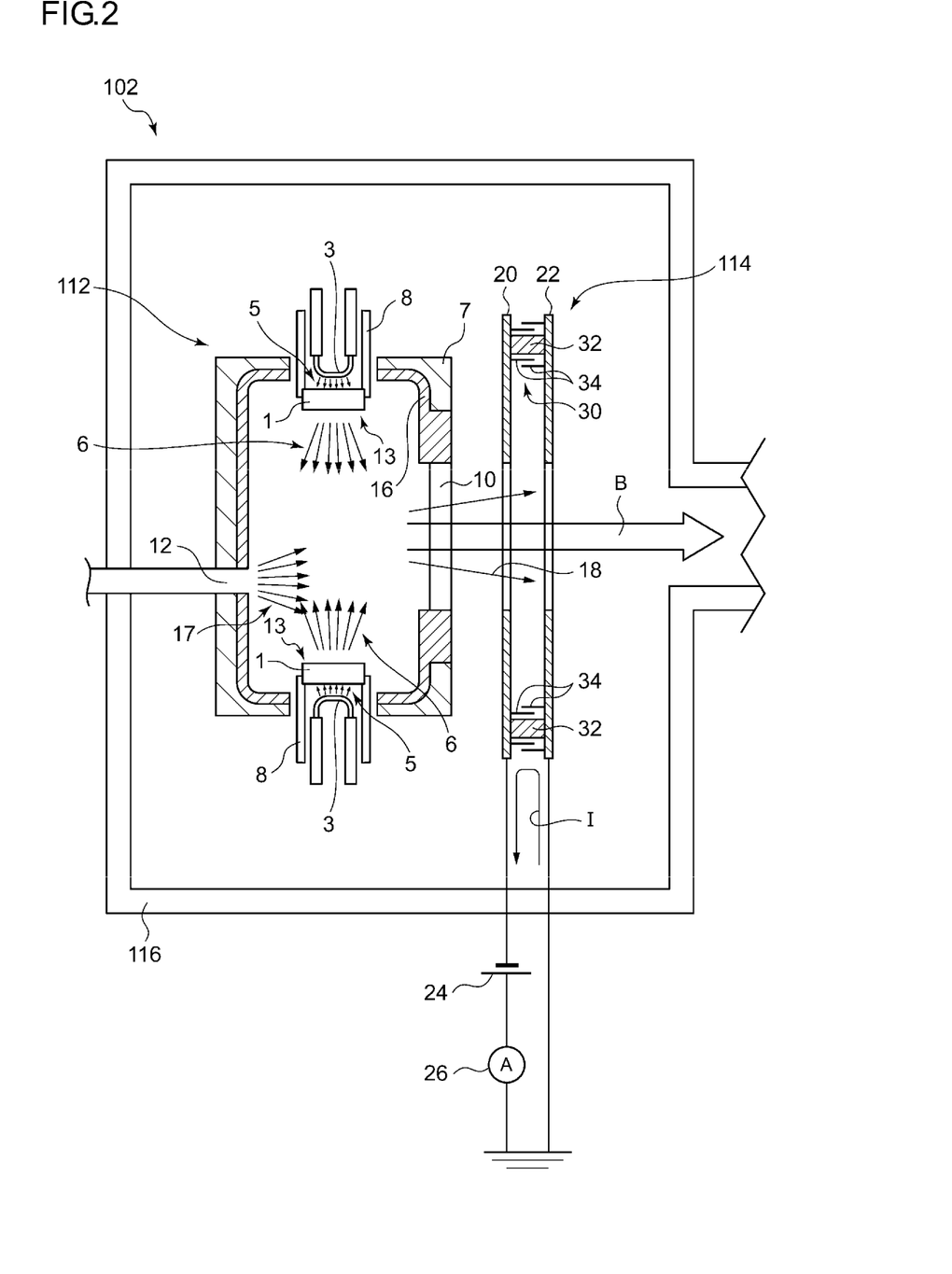
FIG. 2 schematically illustrates an ion source unit according to an embodiment of the present invention.

FIG. 2 schematically illustrates the ion source unit 102 according to an embodiment of the present invention. The ion source unit 102 includes an ion source vacuum chamber 116 arranged to house the ion source 112 and the extraction electrode section 114. Although the ion source 112 illustrated in the figure is an ion source with indirectly heated type cathode, the ion source to which the present invention is applicable is not limited to this specific indirectly heated type cathode ion source.

An arc chamber 7 as a plasma generating section is provided with two cathodes 13. One cathode 13 is arranged on an upper portion of the arc chamber 7 while the other cathode 13 is arranged on a lower portion of the arc chamber 7. Each cathode 13 includes a cathode cap 1 and a filament 3. The cathode caps 1 and the filaments 3 are arranged symmetrically in a direction of a magnetic field of the arc chamber 7. Around each cathode cap 1 and each filament 3 is provided a thermal break 8. Also, one side of the arc chamber 7 is provided with a gas inlet 12 while the other side opposed to the gas inlet 12 is provided with an extraction opening 10.

A liner 16 as an inner wall of the plasma generating section is provided in the arc chamber 7. The liner 16 is made of a material containing carbon such as a carbon material (for example, graphite and glass-like carbon). An entire (or at least partial) portion of an inner surface of the arc chamber 7 is covered with the liner 16. This can reduce metal contamination of the ion beam. The liner 16 is divided into several parts and is formed to conform to a shape of the inner surface of the arc chamber 7 and is mounted on the inner wall of the arc chamber 7 by fitting.

The ion source 112 includes an extraction power supply (not illustrated) configured to apply extraction voltage to the arc chamber 7. The ion source 112 also includes a filament power supply (not illustrated) for the filament 3 and a cathode power supply (not illustrated) for the cathode 13.

The extraction electrode section 114 includes a plurality of electrodes including a first electrode 20 as a suppression electrode and a second electrode 22 as a ground electrode. The first electrode 20 and the second electrode 22 are made of stainless steel, graphite, molybdenum, or tungsten, for example. The first electrode 20 and the second electrode 22 are respectively provided with openings corresponding to the extraction opening 10 to allow the ion beam B to pass therethrough, as illustrated in the figure. Each of these openings is formed in a vertically elongated hole shape, for example.

The first electrode 20 is connected to a suppression power supply 24. The suppression power supply 24 is provided to apply negative potential to the first electrode 20 relative to the second electrode 22. The first electrode 20 is connected with ground potential via the suppression power supply 24, and on a current path from the first electrode 20 to ground potential is provided a suppression ammeter 26. The second electrode 22 is connected with ground potential.

The suppression ammeter 26 is provided to monitor suppression current as flow of electrons between the first electrode 20 and the ground potential. When the ion beam B is extracted normally, the suppression current is sufficiently low. A certain limit value is set in advance in the suppression current. When suppression current exceeding this limit value is detected, operations of the ion source 112 are stopped (for example, application of high voltage to the arc chamber 7 and/or the extraction electrode section 114 is stopped).

An insulation structure 30 for insulation between the first electrode 20 and the second electrode 22 is provided between the first electrode 20 and the second electrode 22. Although details thereof will be described below with reference to FIG. 3, the insulation structure 30 includes an insulation member 32 configured to support the first electrode 20 to the second electrode 22 and at least one protection member 34 configured to protect the insulation member 32 from contamination particles 18.

The insulation structure 30 includes a plurality of combinations of the insulation member 32 and the protection member 34. A plurality of sets of the insulation member 32 and the protection member 34 are arranged at outer circumferential portions of the first electrode 20 and the second electrode 22 to surround the openings for extraction of the ion beam B. For example, one set is provided on one side of the openings while another set is provided on an opposite side of the openings. One set of the insulation member 32 and the protection member 34 may be provided on an upper side of the openings while another set may be provided on a lower side of the openings. Alternatively, the insulation members 32 and the protection members 34 may be provided on right and left sides of the openings. Alternatively, the insulation members 32 and the protection members 34 may be provided on four corners of the openings.

Figure 3:
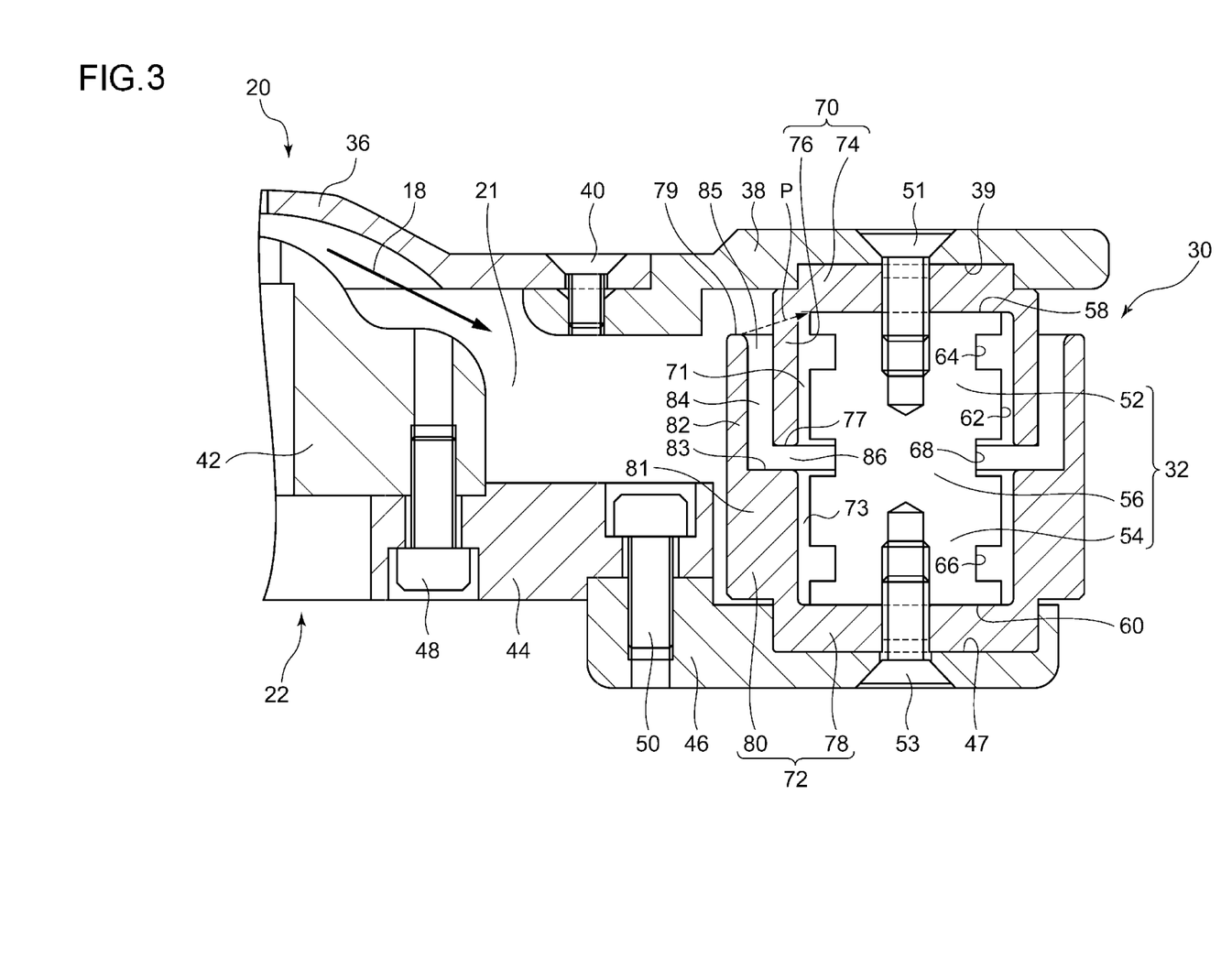
FIG. 3 is a cross-sectional view schematically illustrating an insulation structure according to an embodiment of the present invention.

FIG. 3 is a cross-sectional view schematically illustrating the insulation structure 30 according to an embodiment of the present invention. As illustrated in FIG. 3, the first electrode 20 includes a suppression electrode 36 and a suppression electrode carrier 38 supporting the suppression electrode 36. The suppression electrode 36 is attached to the suppression electrode carrier 38 by a fastening member 40 as illustrated in the figure.

The second electrode 22 includes a ground electrode 42, a ground electrode carrier 44, and a ground electrode bracket

46. The ground electrode 42 is arranged to be adjacent to the suppression electrode 36 with a small gap inbetween. The ground electrode 42 is attached to the ground electrode carrier 44 by a fastening member 48 and is supported by the ground electrode carrier 44. The ground electrode bracket 46 is provided to attach the ground electrode carrier 44 to the insulation structure 30. The ground electrode carrier 44 is attached to the ground electrode bracket 46 by a fastening member 50.

The insulation member 32 includes a first part 52 connected to the first electrode 20 and a second part 54 connected to the second electrode 22. The first part 52 is connected to the suppression electrode carrier 38 while the second part 54 is connected to the ground electrode bracket 46. The insulation member 32 also includes a middle part 56 between the first part 52 and the second part 54. The insulation member 32 is formed as an integral member having the first part 52, the second part 54, and the middle part 56.

The insulation member 32 is formed roughly in a columnar shape. The insulation member 32 includes a first end surface 58 on a side of the first electrode 20, a second end surface 60 on a side of the second electrode 22, and an insulation member side surface 62 connecting the first end surface 58 to the second end surface 60. The first end surface 58 and the second end surface 60 are in circular shapes having equal diameters, and the insulation member side surface 62 is a cylindrical surface. Meanwhile, the insulation member 32 may be a rod-like body having another arbitrary shape such as a prismatic shape.

The first part 52, the second part 54, and the middle part 56 of the insulation member 32 respectively have on outer circumferences thereof a first recess 64, a second recess 66, and a third recess 68. These recesses are arranged on the insulation member side surface 62 at regular intervals in order of the first recess 64, the third recess 68, and the second recess 66. The first recess 64, the second recess 66, and the third recess 68 are grooves formed on an entire circumference of the insulation member 32. By forming such recesses, a creepage distance between the first end surface 58 and the second end surface 60 on the insulation member side surface 62 can be long.

The insulation member 32 is made of a low-hardness and brittle insulation material. The insulation member 32 is made of a machinable ceramic having Vickers hardness of 5 GPa or less, for example. The machinable ceramic is a free-machining, especially, free-cutting, ceramic. The insulation member 32 is made of boron nitride, for example.

Alternatively, the insulation member 32 may be made of a mica ceramic (for example, Macor, Photoveel, or Macerite (Registered Trademarks)). The insulation member 32 may be made of a porous ceramic such as porous alumina, porous silica glass, and porous zirconia. The insulation member 32 may be made of a porous ceramic having Vickers hardness of 5 GPa or less. The machinable ceramic or the porous ceramic may be a mixture of a plurality of materials or a composite material.

The insulation structure 30 includes a first cover 70 as a first protection member configured to protect at least the first part 52 of the insulation member 32 from the contamination particles 18 and a second cover 72 as a second protection member configured to protect at least the second part 54 of the insulation member 32 from the contamination particles 18. The first cover 70 encloses the first part 52 and is supported by the first electrode 20. The second cover 72 encloses the second part 54 and is supported by the second electrode 22.

Between the first cover 70 and the first part 52 is formed a first gap 71 surrounding the first part 52. Between the second cover 72 and the second part 54 is formed a second gap 73 surrounding the second part 54. The first recess 64 resides midway in the first gap 71, and the second recess 66 resides midway in the second gap 73. The first gap 71 and the second gap 73 are separated by the third recess 68.

The second cover 72 is provided outside the first cover 70. The second cover 72 includes a base portion surrounding the second part 54 of the insulation member 32 and a tip end portion extending from this base portion toward the first electrode 20 to surround the first cover 70. Between the tip end portion and the first cover 70 is formed a third gap 84. The second cover 72 is away from the first cover 70, and the second cover 72 and the first cover 70 do not contact each other.

The first cover 70 and the second cover 72 are made of a conductive carbon material such as pyrolytic graphite. The first cover 70 and the second cover 72 thus have adsorption surfaces adsorbing the contamination particles 18. The adsorption surface is a porous surface, for example. Adsorption performance correlates with "a roughness factor," which is a known parameter. The roughness factor means a ratio of a real surface area to a geometric surface area. To obtain favorable adsorption performance, the first cover 70 and the second cover 72 desirably have the roughness factor of 200 or higher. Conversely, the roughness factor of a smooth surface such as a metal is typically less than 5.

The first cover 70 and the second cover 72 are conductive and are directly supported by the first electrode 20 and the second electrode 22, respectively. Hence, potential of the first cover 70 is equal to that of the first electrode 20 while potential of the second cover 72 is equal to the second electrode 22.

Alternatively, the first cover 70 and the second cover 72 may be made of a ceramic. The first cover 70 and the second cover 72 may be made of a machinable ceramic such as boron nitride or a porous ceramic.

The first cover 70 is a so-to-speak lid covering the first part 52 of the insulation member 32. The first cover 70 is formed roughly in a cylindrical shape closed on the side of the first electrode 20 and opened on the side of the second electrode 22. The first cover 70 is disposed coaxially with the insulation member 32. An inner diameter of the first cover 70 is larger than an outer diameter of the insulation member 32, and the first gap 71 is thus formed between the first cover 70 and the insulation member 32. Meanwhile, the first cover 70 may be a tubular body formed in another arbitrary shape such as a rectangular tubular shape.

The first cover 70 includes a first contact portion 74 in the form of a disk and a cylindrical first side wall 76. The first contact portion 74 contacts the first part 52 of the insulation member 32 and is sandwiched between the first part 52 and the first electrode 20. The first side wall 76 extends from an outer circumferential portion of the first contact portion 74 toward the second electrode 22. Between an inner surface of the first side wall 76 and the insulation member side surface 62 is provided the first gap 71, and at a deepest portion of the first gap 71 is formed a boundary part of the first cover 70, the insulation member 32, and the first gap 71 (that is, a triple point as a boundary of a conductor, an insulator, and vacuum).

The first contact portion 74 contacts the first end surface 58 on one surface thereof and the suppression electrode carrier 38 on the opposite surface thereof. The suppression electrode carrier 38 is provided with a first positioning recess 39 for the first cover 70. As illustrated in the figure, the first contact portion 74 has a protrusion fitted in this first positioning recess 39. By fitting this protrusion into the first positioning recess 39, the first cover 70 can be positioned at an attaching position easily.

The first part 52 of the insulation member 32 is attached to the first electrode 20 by a first fastening member 51. The first fastening member 51 is disposed on a central axis of the insulation member 32. The first fastening member 51 is a head screw, for example. The suppression electrode carrier 38 and the first contact portion 74 are provided with through holes (screw holes) formed so as to allow the first fastening member 51 to pass therethrough. These through holes continue into a first fastening hole (screw hole) of the insulation member 32. Since the insulation member 32, the first cover 70, and the first electrode 20 can be fixed by attachment of a single member, attachment work is simple.

The second cover 72 is a so-to-speak lid covering the second part 54 of the insulation member 32. The second cover 72 is formed roughly in a cylindrical shape closed on the side of the second electrode 22 and opened on the side of the first electrode 20. The second cover 72 is disposed coaxially with the insulation member 32. An inner diameter of the second cover 72 is larger than the outer diameter of the insulation member 32, and the second gap 73 is thus formed between the second cover 72 and the insulation member 32. Meanwhile, the second cover 72 may be a tubular body formed in another arbitrary shape such as a rectangular tubular shape.

The second cover 72 includes a second contact portion 78 in the form of a disk and a cylindrical second side wall 80. The second contact portion 78 contacts the second part 54 of the insulation member 32 and is sandwiched between the second part 54 and the second electrode 22.

The second contact portion 78 contacts the second end surface 60 on one surface thereof and the ground electrode bracket 46 on the opposite surface thereof. The ground electrode bracket 46 is provided with a second positioning recess 47 for the second cover 72. As illustrated in the figure, the second contact portion 78 has a protrusion fitted in this second positioning recess 47. By fitting this protrusion into the second positioning recess 47, the second cover 72 can be positioned at an attaching position easily.

The second part 54 of the insulation member 32 is attached to the second electrode 22 by a second fastening member 53. The second fastening member 53 is disposed on the central axis of the insulation member 32. The second fastening member 53 is a head screw, for example. The ground electrode bracket 46 and the second contact portion 78 are provided with through holes (screw holes) formed so as to allow the second fastening member 53 to pass therethrough. These through holes continue into a second fastening hole (screw hole) of the insulation member 32. Since the insulation member 32, the second cover 72, and the second electrode 22 can be fixed by attachment of a single member, attachment work is simple.

The second side wall 80 extends from an outer circumferential portion of the second contact portion 78 toward the first electrode 20. The second side wall 80 includes a thick portion 81 on the side of the second electrode 22 and a thin portion 82 on the side of the first electrode 20. An outer diameter of the thick portion 81 is equal to an outer diameter of the thin portion 82, and an inner diameter of the thick portion 81 is smaller than an inner diameter of the thin portion 82. Thus, a step 83 is formed between the thick portion 81 and the thin portion 82. The step 83 is inside the second cover 72. Between an inner surface of the thick portion 81 and the insulation member side surface 62 is provided the second gap 73, and at a deepest portion of the second gap 73 is formed a boundary part of the second cover 72, the insulation member 32, and the second gap 73 (that is, a triple point as a boundary of a conductor, an insulator, and vacuum).

The first cover 70 and the second cover 72 are disposed to form the third gap 84 allowing entry of the contamination particles 18. The third gap 84 is between the first cover 70 and the second cover 72. An entrance 85 to the third gap 84 continues into a space 21 between the first electrode 20 and the second electrode 22. The entrance 85 is a gap between the first side wall 76 and the thin portion 82 of the second side wall 80. An exit 86 of the third gap 84 is a gap between a first cover end 77 as a tip end of the first side wall 76 and the step 83. The third gap 84 has a bent portion between the entrance 85 and the exit 86. The exit 86 is opposed to the third recess 68 of the insulation member 32. In this manner, the third recess 68 is located in the vicinity of the third gap 84.

The first cover 70 extends between the second cover 72 and the insulation member 32 to block a line of sight (illustrated by a dashed arrow P in FIG. 3) from a second cover end 79 as a tip end of the second side wall 80 to an outer circumference of the first end surface 58 of the insulation member 32. Accordingly, the boundary part of the first cover 70, the insulation member 32, and the first gap 71 is not seen from the entrance 85 of the third gap 84. Also, the boundary part of the second cover 72, the insulation member 32, and the second gap 73 is not seen from the entrance 85 of the third gap 84. In this manner, the insulation structure 30 is configured to hide the triple points as boundaries of conductors, insulators, and vacuum from outside.

Figure 4:
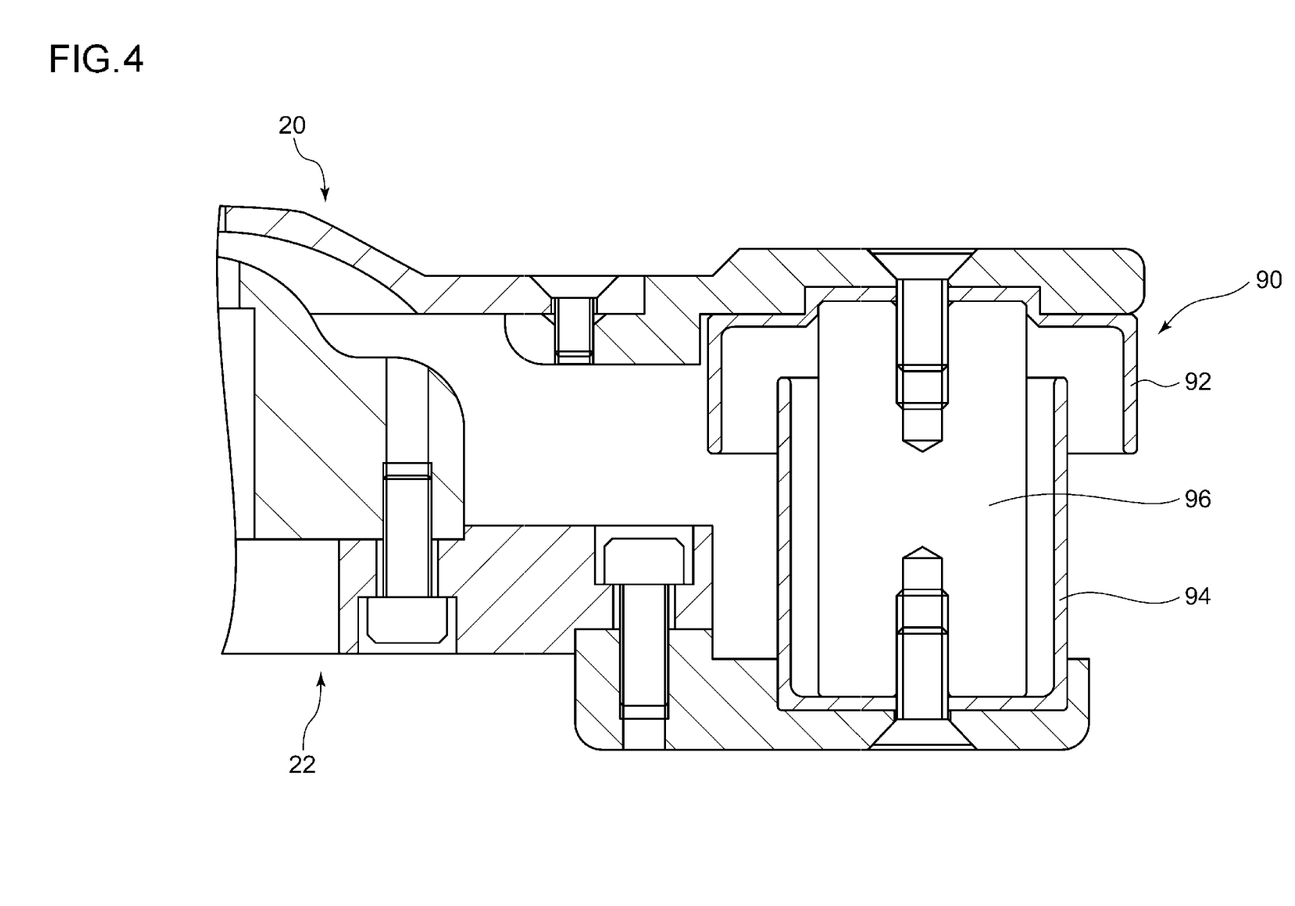
FIG. 4 is a cross-sectional view schematically illustrating an insulation structure according to another embodiment of the present invention.

FIG. 4 illustrates another insulation structure 90. In FIG. 4, a first cover 92 is arranged outside while a second cover 94 is arranged inside in an opposite manner of the insulation structure 30 illustrated in FIG. 3. However, the first cover 92 and the second cover 94 are made of a metal (for example, stainless steel). An insulation member 96 is made of a high-hardness ceramic (for example, alumina). The other parts illustrated in FIG. 4 are substantially similar to those in FIG. 3.

In an embodiment, the cover arrangement illustrated in FIG. 4 may be adopted.

Operations of the present apparatus will be described. In the ion source 112, positive potential, for example, at tens of kV, is applied to the arc chamber 7. By supplying direct current to the filament 3, the filament 3 is heated to generate thermal electrons 5. The generated thermal electrons 5 are accelerated by voltage between the cathode cap 1 and the filament 3, flow into the cathode cap 1, and heat the cathode cap 1. The heated cathode cap 1 further supplies the thermal electrons 6 in the arc chamber 7, gas 17 supplied from the gas inlet 12 reacts with the thermal electrons, and plasma is generated and maintained.

In the extraction electrode section 114, negative potential at several kV is applied to the first electrode 20, and a potential difference is provided between the first electrode 20 and the second electrode 22. The ion beam B is extracted from the arc chamber 7 with use of the extraction electrode section 114. The ion beam B is delivered to the beamline unit 104 via the extraction opening 10 and the extraction electrode section 114. The ion beam B passes through the beamline unit 104 to irradiate the substrate W in the implantation processing chamber 106. At this time, the insulation member 32 is protected from the contamination particles 18 by the protection member 34 (for example, the first cover 70 and the second cover 72).

The gas 17 supplied from the gas inlet 12 of the arc chamber 7 is often corrosive or highly-reactive gas such as fluoride. The gas 17 and/or ions generated there react with an inner wall of the arc chamber 7, and consequently, the contamination particles 18 are released from the wall and can be extracted outside the arc chamber 7 together with the ion beam B.

For example, in a case where the gas 17 contains boron trifluoride ($BF_3$), not only dopant ions such as $B^+$ and $BF_2^+$ but also fluorine ions ($F^+$) are generated. When the fluorine ions bond with carbon (C) of the liner 16, $CF_x$ molecules are released. By ionization of $CF_x$ in the plasma, ions containing carbon ($CF_x^+$, $C^+$, and the like) are generated. In this manner, the conductive contamination particles 18 (that is, C, $CF_x$, $CF_x^+$, $C^+$, and the like) can be released or extracted outside the arc chamber 7.

The contamination particles 18 can be deposited on surfaces of the components of the apparatus. Since the deposit is conductive, the deposit can form a conductive path on the surfaces of the components. In a case where the contamination particles 18 cover the insulation member 32, insulation between the first electrode 20 and the second electrode 22 may be insufficient.

Also, when contamination advances in the triple point region, micro discharge between the conductor and the insulator is easy to occur in the region. The conductor may be melted by the micro discharge and fuse to the insulator, and strong conductive coupling may be formed between the conductor and the insulator. In a case where the metal is brought into contact with the high-hardness ceramic as in the configuration illustrated in FIG. 4, such a phenomenon may tend to occur.

In a case where insulation performance of the insulation structure 30 is lowered, leak current I will flow between the first electrode 20 and the second electrode 22. The leak current I flows from the second electrode 22 via the insulation structure 30, the first electrode 20, the suppression power supply 24, and the suppression ammeter 26 to the ground potential. Thus, an increase in the leak current I leads to an increase in a measurement value of the suppression ammeter 26, which causes an apparent increase in suppression current.

When a conductive film by the contamination particles 18 grows on the insulation member 32, the increase in the leak current I may cause the measurement value of the suppression ammeter 26 to exceed the aforementioned limit value. In this case, operations of the ion source 112 will be stopped although actual suppression current is kept in a normal level. Maintenance such as cleaning or exchange of the insulation member 32 is required. Since the operations cannot be resumed during the maintenance, an operation ratio of the apparatus is lowered.

However, in the present embodiment, the insulation member 32 is made of a low-hardness and brittle insulation material such as boron nitride. Even in a case where the micro discharge occurs around the triple point, an external force (such as impact) by the micro discharge can give small deformation or damage to the discharged part since the hardness of the material is low. Thus, the aforementioned strong conductive coupling is difficult to occur, which facilitates retainment of insulation around the triple point. Also, in the present embodiment, the first cover 70 with negative potential is made of a high-melting-point material such as graphite. Thus, even in a case where the micro discharge occurs, fusion of the conductor is difficult to occur. This also contributes to retainment of insulation around the triple point.

Further, the triple point on the side of the first electrode 20 is covered with the first cover 70 with equal potential, and an electric field around the triple point is weak. This can suppress occurrence of the micro discharge. On the other hand, in the configuration illustrated in FIG. 4, a tip end of the second cover 94 as a positive electrode is in the vicinity of the triple point on the side of the first electrode 20 as a negative electrode, and thus the electric field around the triple point is strong.

Also, in the present embodiment, the protection member 34 (for example, the first cover 70 and the second cover 72) is made of a material having an adsorption surface adsorbing the contamination particles 18, for instance, graphite. By an adsorbing effect of the protection member 34, the amount of the contamination particles 18 reaching the surface of the insulation member 32 from the space 21 between the first electrode 20 and the second electrode 22 can be reduced.

In addition to such improvement of materials, a shape and arrangement of the protection member 34 are also improved in the present embodiment. For example, the third gap 84 as an entrance path of the contamination particles 18 from an outside of the insulation structure 30 to an inside of the insulation structure 30 has the bent portion between the entrance 85 and the exit 86. Thus, most of the contamination particles 18 entering the third gap 84 are trapped on the surface of the first cover 70 or the second cover 72 at the bent portion.

Also, the exit 86 of the third gap 84 is opposed to the third recess 68 formed in the middle part 56 of the insulation member 32. In this manner, the contamination particles 18 can be received in the third recess 68 in a focused manner. Thus, the amount of the contamination particles 18 entering the first gap 71 and the second gap 73 can be reduced. Since the third recess 68 is located away from the triple points at both ends of the insulation member 32, contamination around the triple points can be restricted.

Further, the shape and arrangement of the protection member 34 are defined so that the triple points cannot be directly seen from the outside of the insulation structure 30. Thus, the contamination particles 18 are difficult to reach the triple points.

Accordingly, with the present embodiment, insulation lowering between the electrodes is restricted, and the apparent increase in suppression current caused by the leak current I can be prevented. That is, with the present embodiment, the long-lived insulation structure 30 can be provided.

Figure 5:
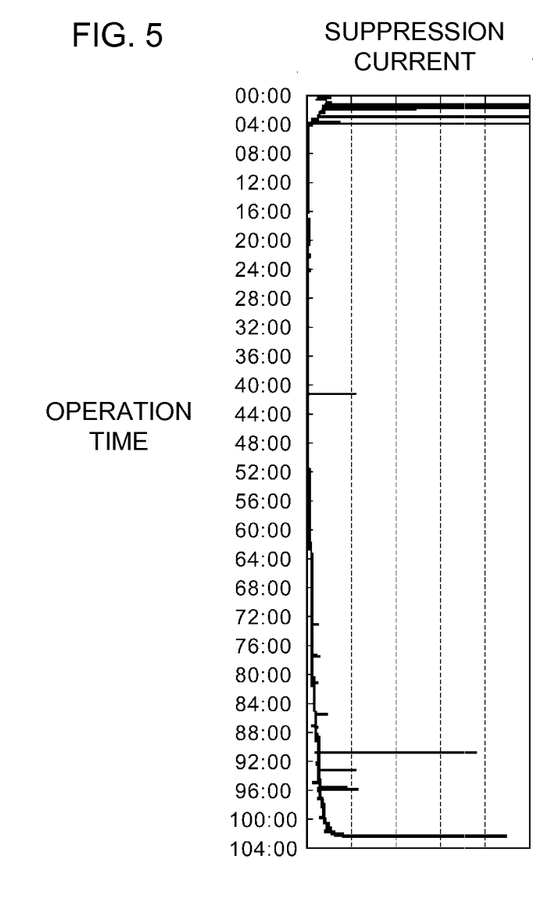
FIG. 5 is a graph illustrating suppression current in an embodiment of the present invention.
Figure 6:
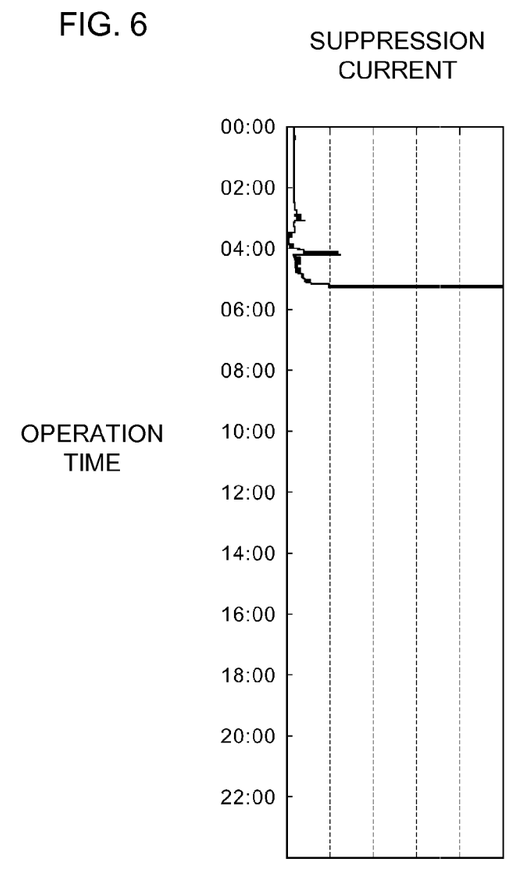
FIG. 6 is a graph illustrating suppression current in a comparative example.

According to an experiment by the present inventor, in a case where the first cover 92 and the second cover 94 were made of stainless steel, and where the insulation member 96 was made of alumina, in the configuration illustrated in FIG. 4, it took about five hours until the suppression current reached the limit value under certain beam conditions (refer to FIG. 6). On the other hand, in a case where the first cover 70 and the second cover 72 were made of graphite, and where the insulation member 32 was made of boron nitride, in the configuration described with reference to FIG. 3, it took as long as about 100 hours until the suppression current reached the limit value under the same beam conditions (refer to FIG. 5).

Especially, the present inventor confirmed by the experiment that adopting a low-hardness and brittle material for the insulation member brought about a remarkable effect. For example, in a case where boron nitride was adopted for the insulation member in the configuration illustrated in FIG. 4, obtained was a lifetime approximately twice as long as that in a case where the insulation member was alumina (in these cases, the first cover 92 and the second cover 94 were stainless steel).

The present inventor also confirmed by the experiment that adopting a material having an adsorption surface for the protection member brought about a remarkable effect. For example, in a case where graphite was adopted for the protection member in the configuration illustrated in FIG. 4, obtained was a lifetime approximately 1.6 times as long as that in a case where the protection member was stainless steel (in these cases, the insulation member 96 was alumina).

Described above is an explanation based on the exemplary embodiments of the present invention. The invention is not limited to the above-mentioned embodiments, and various design modifications may be added. It will be obvious to those skilled in the art that such modifications are also within the scope of the present invention.

In the above embodiment, the insulation structure 30 has the covers for the triple points at both the electrodes, respectively. However, the insulation structure may include the protection member provided with at least one of the first electrode and the second electrode. For example, a single protection member may be provided on the side of the first electrode, to which negative potential is applied. Alternatively, the insulation structure may include no protection member.

In the above embodiment, the first electrode 20 is a suppression electrode while the second electrode 22 is a ground electrode. However, the insulation structure may be used as a support between other electrodes or as a support between an electrode and a structure around the electrode. For example, the insulation structure may be provided between a plasma electrode (a part of the plasma generating section facing the suppression electrode) and the suppression electrode.

In the above embodiment, the insulation member 32 is a single member made of a machinable ceramic or a porous ceramic. However, the insulation member 32 may consist of a plurality of pieces. For example, the insulation member 32 may be separable into the first part 52 and the second part 54 (and/or the middle part 56). At least one of the first part 52 and the second part 54 may be made of a machinable ceramic or a porous ceramic. A part (for example, the middle part 56) of the insulation member 32 may be made of a material other than a machinable ceramic or a porous ceramic such as a high-hardness ceramic (for example, alumina).

The protection member 34 may similarly consist of a plurality of pieces. For example, the first cover 70 may be separable into the first contact portion 74 and the first side wall 76. At least a part (for example, the first contact portion 74 or the first side wall 76) of the protection member 34 may be made of a material adsorbing the contamination particles or a conductive carbon material.

The protection member 34 may surround at least a part of the insulation member 32. The protection member 34 does not have to cover the insulation member 32 completely. For example, the protection member 34 may have holes and slits. Also, the protection member 34 does not have to surround the insulation member 32. For example, a part (for example, the middle part 56) of the insulation member 32 may be a protection member providing an adsorption surface for the contamination particles.

In the above embodiment, the first cover 70 and the second cover 72 have respectively portions overlapping in an axial direction of the insulation member 32. However, the first cover 70 and the second cover 72 do not have to overlap in the axial direction of the insulation member 32. For example, a tip end of the first cover 70 and a tip end of the second cover 72 may be opposed to each other, and the third gap 84 may be formed between the tip ends.

In the above embodiment, the insulation member 32 is attached to the first electrode 20 and the second electrode 22 via the protection member 34 (the first cover 70 and the second cover 72). However, each of the insulation member 32 and the protection member 34 may be individually attached to the first electrode 20 and the second electrode 22. For example, the insulation member 32 may be directly attached to the first electrode 20 and the second electrode 22, and the protection member 34 may be directly attached to the first electrode 20 and/or the second electrode 22 to surround the insulation member 32.

The embodiments of the present invention may also be expressed in the following manner.

1. An insulation structure provided among a plurality of electrodes for extraction of an ion beam from a plasma generating section, the plurality of electrodes comprising a first electrode and a second electrode to which different potential from that of the first electrode is applied, the insulation structure comprising:

an insulation member comprising a first part connected to the first electrode and a second part connected to the second electrode and configured to support the first electrode to the second electrode;

a first protection member surrounding at least a part of the first part to protect the first part from contamination particles; and a second protection member surrounding at least a part of the second part to protect the second part from contamination particles, wherein at least one of the first part and the second part is made of a machinable ceramic or a porous ceramic.

2. The insulation structure according to Embodiment 1, wherein the machinable ceramic or the porous ceramic has Vickers hardness of 5 GPa or less.

3. The insulation structure according to Embodiment 1 or 2, wherein the machinable ceramic includes boron nitride.

4. The insulation structure according to any one of Embodiments 1 to 3, wherein the porous ceramic includes porous alumina.

5. The insulation structure according to any one of Embodiments 1 to 4, wherein at least one of the first protection member and the second protection member is made of a conductive carbon material.

6. The insulation structure according to any one of Embodiments 1 to 5, wherein at least one of the first protection member and the second protection member comprises an adsorption surface adsorbing the contamination particles.

7. The insulation structure according to Embodiment 6, wherein the adsorption surface has a roughness factor of 200 or higher.

8. The insulation structure according to any one of Embodiments 1 to 7, wherein the insulation member comprises a middle part between the first part and the second part, and the middle part has a recess on a surface thereof, and wherein the first protection member and the second protection member are arranged to form a gap allowing entry of the contamination particles between the first protection member and the second protection member, and the recess is in vicinity of the gap.

9. The insulation structure according to any one of Embodiments 1 to 8, wherein the first protection member extends between the second protection member and the insulation member to block a line of sight from an end of the second protection member proximate to the first electrode to an end of the insulation member on a side of the first electrode.

10. The insulation structure according to any one of Embodiments 1 to 9, wherein
the first protection member surrounds the first part and is supported on the first electrode,
the second protection member is provided outside the first protection member, and
to the first electrode is applied negative potential relative to the second electrode.

11. The insulation structure according to any one of Embodiments 1 to 10, wherein
the first protection member comprises a first contact portion contacting the first part, and the first contact portion is sandwiched between the first part and the first electrode, and/or
the second protection member includes a second contact portion contacting the second part, and the second contact portion is sandwiched between the second part and the second electrode.

12. The insulation structure according to Embodiment 11, wherein
the first electrode has a first positioning recess in which the first contact portion is fitted, and/or
the second electrode has a second positioning recess in which the second contact portion is fitted.

13. The insulation structure according to Embodiment 11 or 12, wherein
the first part is attached to the first electrode by a first fastening member penetrating the first electrode and the first contact portion, and/or
the second part is attached to the second electrode by a second fastening member penetrating the second electrode and the second contact portion.

14. The insulation structure according to any one of Embodiments 1 to 13, wherein
the plasma generating section comprises an inner wall that contains carbon.

15. The insulation structure according to Embodiment 1, comprising:
a single protection member on a side of the first electrode instead of the first protection member and the second protection member, wherein
to the first electrode is applied negative potential relative to the second electrode.

16. An ion source unit comprising the insulation structure according to any one of Embodiments 1 to 15.

17. An ion implantation apparatus comprising the insulation structure according to anyone of Embodiments 1 to 15.

18. An insulation method, comprising:
applying a potential difference between a first electrode and a second electrode supporting the first electrode by an insulation member;
extracting an ion beam from a plasma generating section by using the first electrode and the second electrode; and
protecting the insulation member from contamination particles by using a protection member, wherein
the insulation member comprises a first part connected to the first electrode and a second part connected to the second electrode, and at least one of the first part and the second part is made of a machinable ceramic or a porous ceramic.

19. An insulation structure provided among a plurality of electrodes for extraction of an ion beam from a plasma generating section, the plurality of electrodes comprising a first electrode and a second electrode to which different potential from that of the first electrode is applied, the insulation structure comprising:
an insulation member configured to support the first electrode to the second electrode; and
a protection member configured to protect the insulation member from contamination particles, wherein
the protection member comprises an adsorption surface adsorbing the contamination particles.

20. An insulation structure provided among a plurality of electrodes for extraction of an ion beam from a plasma generating section, the plurality of electrodes comprising a first electrode and a second electrode to which different potential from that of the first electrode is applied, the insulation structure comprising:
an insulation member configured to support the first electrode to the second electrode, wherein
the insulation member comprises a first part on a side of the first electrode and a second part on a side of the second electrode, and at least one of the first part and the second part is made of a machinable ceramic or a porous ceramic.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2013-115318, filed on May 31, 2013, the entire content of which is incorporated herein by reference.

What is claimed is:

1. An insulation structure provided among a plurality of electrodes for extraction of an ion beam from a plasma generating section, the plurality of electrodes comprising a first electrode and a second electrode to which different potential from that of the first electrode is applied, the insulation structure comprising:
an insulation member comprising a first part connected to the first electrode and a second part connected to the second electrode and configured to support the first electrode to the second electrode, the first part having a first circular end surface on a side of the first electrode, the second part having a second circular end surface on a side of the second electrode, the insulation member having a cylindrical side surface that connects the first end surface to the second end surface, the cylindrical side surface having a recess formed thereon and positioned between the first end surface and the second end surface;
a first protection member surrounding at least a part of the first part to protect the first part from contamination particles; and
a second protection member surrounding at least a part of the second part to protect the second part from contamination particles, wherein
at least one of the first part and the second part is made of a machinable ceramic or a porous ceramic;
the first protection member is a first cover having a first cover end,
the second protection member is a second cover having a second contact portion and a second stepped side wall, the second contact portion contacting the second part and sandwiched between the second part and the second electrode, the second stepped side wall extending from the second contact portion toward the first electrode to form a pathway of the contamination particles between the first cover and the second stepped side wall,
the second stepped side wall comprises a thin wall portion, a thick wall portion, and a step of the stepped side wall formed between the thin wall portion and the thick wall portion, the thin wall portion surrounding the first cover end, the thick wall portion extending from an outer circumferential portion of the second contact portion to the thin wall portion and terminating at the step of the stepped side wall, an exit of the pathway is formed between the first cover end and the step, the exit opposed to the recess.

2. The insulation structure according to claim 1, wherein the machinable ceramic or the porous ceramic has Vickers hardness of 5 GPa or less.

3. The insulation structure according to claim 1, wherein the machinable ceramic includes boron nitride.

4. The insulation structure according to claim 1, wherein the porous ceramic includes porous alumina.

5. The insulation structure according to claim 1, wherein at least one of the first protection member and the second protection member is made of a conductive carbon material.

6. The insulation structure according to claim 1, wherein at least one of the first protection member and the second protection member comprises an adsorption surface adsorbing the contamination particles.

7. The insulation structure according to claim 6, wherein the adsorption surface has a roughness factor of 200 or higher.

8. The insulation structure according to claim 1, wherein the insulation member comprises a middle part between the first part and the second part, and the middle part has the recess on a surface thereof, and wherein the first protection member and the second protection member are arranged to form a gap allowing entry of the contamination particles between the first protection member and the second protection member, and the recess is in vicinity of the gap.

9. The insulation structure according to claim 1, wherein the first protection member extends between the second protection member and the insulation member to block a line of sight from an end of the second protection member proximate to the first electrode to an end of the insulation member on a side of the first electrode.

10. The insulation structure according to claim 1, wherein the first protection member surrounds the first part and is supported on the first electrode, the second protection member is provided outside the first protection member, and to the first electrode is applied negative potential relative to the second electrode.

11. The insulation structure according to claim 1, wherein the first protection member comprises a first contact portion contacting the first part, and the first contact portion is sandwiched between the first part and the first electrode.

12. The insulation structure according to claim 11, wherein the first electrode has a first positioning recess in which the first contact portion is fitted, and/or the second electrode has a second positioning recess in which the second contact portion is fitted.

13. The insulation structure according to claim 11, wherein the first part is attached to the first electrode by a first fastening member penetrating the first electrode and the first contact portion, and/or the second part is attached to the second electrode by a second fastening member penetrating the second electrode and the second contact portion.

14. The insulation structure according to claim 1, wherein the plasma generating section comprises an inner wall that contains carbon.

15. The insulation structure according to claim 1, wherein the first circular end surface and the second circular end surface have a same diameter and the cylindrical side surface has the same diameter.

16. The insulation structure according to claim 1, wherein the first part has a first additional recess formed on the cylindrical side surface and/or the second part has a second additional recess formed on the cylindrical side surface.

17. An ion source unit comprising the insulation structure according to claim 1.

18. An ion implantation apparatus comprising the insulation structure according to claim 1.

19. An insulation method, comprising:

applying a potential difference between a first electrode and a second electrode supporting the first electrode by an insulation member;

extracting an ion beam from a plasma generating section by using the first electrode and the second electrode; and protecting a first part and a second part of the insulation member from contamination particles by using a first protection member and a second protection member, respectively, wherein the first part is connected to the first electrode and the second part is connected to the second electrode, and at least one of the first part and the second part is made of a machinable ceramic or a porous ceramic, the first part having a first circular end surface on a side of the first electrode, the second part having a second circular end surface on a side of the second electrode, the insulation member having a cylindrical side surface that connects the first end surface to the second end surface, the cylindrical side surface having a recess formed thereon and positioned between the first end surface and the second end surface, the first protection member is a first cover having a first cover end, the second protection member is a second cover comprising a second contact portion and a second stepped side wall, the second contact portion contacting the second part and sandwiched between the second part and the second electrode, the second stepped side wall extending from the second contact portion toward the first electrode to form a pathway of the contamination particles between the first cover and the second stepped side wall, the second stepped side wall has a thin wall portion, a thick wall portion, and a step of the stepped side wall formed between the thin wall portion and the thick wall portion, the thin wall portion surrounding the first cover end, the thick wall portion extending from an outer circumferential portion of the second contact portion to the thin wall portion and terminating at the step of the stepped side wall, an exit of the pathway is formed between the first cover end and the step, the exit opposed to the recess.

20. An insulation structure provided among a plurality of electrodes for extraction of an ion beam from a plasma generating section, the plurality of electrodes comprising a first electrode and a second electrode to which different potential from that of the first electrode is applied, the insulation structure comprising:

an insulation member comprising a first part connected to the first electrode and a second part connected to the second electrode and configured to support the first electrode to the second electrode, the first part having a first circular end surface on a side of the first electrode, the second part having a second circular end surface on a side of the second electrode, the insulation member having a cylindrical side surface that connects the first end surface to the second end surface, the cylindrical side surface having a recess formed thereon and positioned between the first end surface and the second end surface;

a first protection member surrounding at least a part of the first part to protect the first part from contamination particles; and a second protection member surrounding at least a part of the second part to protect the second part from contamination particles, wherein at least one of the first part and the second part is made of a machinable ceramic or a porous ceramic, the first circular end surface and the second circular end surface have a same diameter and the cylindrical side surface has the same diameter, the first protection member has a first tubular part surrounding the first part and the second protection member has a second tubular part surrounding the second part, a first inner diameter of the first tubular part being substantially equal to a second inner diameter of the second tubular part, such that a first gap width between the first tubular part and the first part is substantially equal to a second gap width between the second tubular part and the second part.

21. The insulation structure according to claim 20, wherein a pathway of the contamination particles is formed between a first end of the first tubular part and a second end of the second tubular part facing to the first end, a distance across the pathway from the first end to the second end being greater than the first gap width and the second gap width.

22. The insulation structure according to claim 20, wherein the recess has opposing sidewalls and a bottom between the sidewalls, a depth of the recess from an entrance of the recess to the bottom being greater than the first gap width and the second gap width.

23. The insulation structure according to claim 20, wherein the recess has opposing sidewalls and a bottom between the sidewalls, an interval between the sidewalls being greater than the first gap width and the second gap width, the first part has a first additional recess formed on the cylindrical side surface, a distance along the cylindrical side surface between the recess and the first additional recess being greater than the interval.

\* \* \* \* \*